United States Patent [19]
Opsahl et al.

[11] Patent Number: 5,517,992
[45] Date of Patent: May 21, 1996

[54] MAGNETIC RESONANCE IMAGING OF SHEAR-RATE WITHIN MECHANICALLY VIBRATED MATERIALS

[75] Inventors: Lorinda R. Opsahl, Clifton Park; Charles L. Dumoulin, Ballston Lake, both of N.Y.

[73] Assignee: General Electric Company, Schenectady, N.Y.

[21] Appl. No.: 364,867

[22] Filed: Dec. 27, 1994

[51] Int. Cl.$^6$ .................................................. A61B 5/055
[52] U.S. Cl. ................................. 128/653.2; 128/653.3; 324/306; 324/309
[58] Field of Search ........................... 128/653.2, 653.3; 324/306, 307, 309

[56] References Cited

U.S. PATENT DOCUMENTS

| | | | |
|---|---|---|---|
| 3,932,805 | 1/1976 | Abe et al. | 324/307 |
| 4,837,512 | 6/1989 | Suzuki | 324/306 |
| 5,115,812 | 5/1992 | Sano et al. | 324/306 |
| 5,166,615 | 11/1992 | Sidles | 324/307 |

OTHER PUBLICATIONS

"Sono-Elasticity: Medical Elasticity Images Derived From Ultrasound Signals in Mechanically Vibrated Targets" by R. M. Lerner, et al., Acoust. Imaging 1988, 16:317–327.

"Tissue Response To Mechanical Vibrations for 'Sonoelasticity Imaging'" by K. J. Parker, S. Huang, R. A. Musulin and R. M. Lerner, Ultrasound Med. Biol., 1990, 16:241–246.

Primary Examiner—Krista M. Zele
Assistant Examiner—Brian L. Casler
Attorney, Agent, or Firm—Lawrence P. Zale; Marvin Snyder

[57] ABSTRACT

An elasticity imaging method uses magnetic resonance to detect the distribution of eternally induced velocities within a subject. Distributions am measured responsive to at least two different field-of-views. Differences of the velocity distribution obtained with one field-of-view and the second field-of-view are computed to give a component of stress. The method can be used to obtain velocity measurements in any of three mutually orthogonal directions responsive to field-of-view shifts in as many as three mutually orthogonal directions to give a total of nine stress components. Data for each component can be acquired independently or data acquisition can be multiplexed to reduce data acquisition requirements.

5 Claims, 8 Drawing Sheets

MAGNETIC RESONANCE IMAGING OF SHEAR-RATE WITHIN MECHANICALLY VIBRATED MATERIALS

CROSS REFERENCE TO RELATED APPLICATIONS

This application is related to application "METHODS FOR THE IMAGING OF SHEAR RATE IN MOVING FLUIDS", Ser. No. 08/173,022, filed 12/27/93 by Charles L. Dumoulin and Lorinda R. Opsahl assigned to the present assignee and hereby incorporated by reference.

BACKGROUND OF THE INVENTION

The present invention relates to medical and non-medical procedures in which it is desirable to measure and display the distribution of shear stresses within a subject in response to an external mechanical stimulus. Shear is defined as the change in velocity with respect to position. Shear is an important parameter in many mechanical systems. For example, with flowing fluids, shear (or shear rate) often determines the dynamic effects that the flow exerts on its surroundings. These effects include the rate of corrosion in pipes and the development of arteriosclerotic disease in blood vessels. Shear rates of non-flowing biological tissue is also an important parameter in the diagnosis of disease. The shear rate of a tissue is a measure of the tissues elasticity and elasticity is frequently used to asses tissue characteristics during physical examinations such as palpation. Although traditional fluid flow analysis methods such as ink streamlining and laser Doppler have been used to measure shear in moving fluids, these methods are invasive and are not suitable for in-vivo applications, particularly in the measurement of shear rates in non-flowing tissue.

Imaging of tissue elasticity under dynamic and static mechanical loads has been demonstrated with ultrasonic methods, as described in "Sono-elasticity: Medical elasticity images derived from ultrasound signals in mechanically vibrated targets." by Lerner, R. M. et al., Acoust. Imaging 1988, 16:317–327 and Tissue Response to Mechanical Vibrations For 'SonoElasticity Imaging' by K. J. Parker, S. R. Huang, R. A. Musulin and R. M. Lerner 1990, 16:241–246, both hereby incorporated by reference. While providing a method for non-invasive imaging of sample elasticity, these methods require vast amounts of computing to track ultrasonic speckle patterns and suffer from all the limitations of ultrasonic imaging.

Since velocity is a vector quantity, it can be expressed as the sum of three mutually orthogonal component vectors. Each of these components, in turn, can be measured with respect to three mutually-orthogonal spatial dimensions to give a total of nine different shear measurements. Existing techniques can be used to measure some of these shear components, but detection of all components is difficult or impossible in most situations.

SUMMARY OF THE INVENTION

Methods using Magnetic Resonance (MR) pulse sequences for the acquisition of shear images responsive to an external mechanical stimulus are disclosed. These pulse sequences are comprised of a slice-selective RF pulse, conventional phase-encoding and readout gradient pulses for spatial encoding and a bipolar velocity-encoding gradient pulse to encode velocity as a phase shift in the resulting image. The direction of the velocity-encoding gradient determines the component of the velocity which is detected. If desired the procedure can be repeated to obtain as images sensitive to orthogonal components of velocity.

Imaging of a selected component of shear is performed by repeating the pulse sequence a minimum of four times for each increment of the phase-encoding gradient. In the first acquisition a positive polarity velocity-encoding gradient is applied. In the second acquisition a negative polarity velocity-encoding gradient is applied. During both the first and second acquisition the receiver and transmitter are operated at the same frequency. The third and fourth acquisitions are performed in an identical fashion to the first and second acquisitions, except that the center of the field-of-view is shifted by an amount, D, with respect to the first and second acquisitions.

Data from the first and second acquisitions are used to compute a phase difference data set. The phase of each pixel in the phase difference data set is directly proportional to velocity (assuming no phase wrap). Data from the third and fourth acquisitions are processed in the same way to give a second phase difference data set. Since the third and fourth acquisitions were obtained with an offset field-of-view, however, the second phase difference data set is not exactly registered with the first phase difference data set. Since the first and second phase difference data sets contain velocity information from slightly different points in space a shear image can then be computed by taking the phase difference of the first and second phase difference images.

Shear images with respect to the three orthogonal spatial dimensions can be made by shifting the third and fourth phase images in the readout, phase-encoding and slice selective directions. Multiplexed detection of velocity components can be used to minimize the amount of data which must be collected.

OBJECTS OF THE INVENTION

It is an object of the present invention to provide a method for the detection and display of tissue elasticity within a subject.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing in which:

DETAILED DESCRIPTION OF THE INVENTION

In the present embodiment of the invention, a subject is placed within the magnet of a magnetic resonance imaging system. The region over which a tissue elasticity is to be imaged is then identified by an operator, perhaps with the assistance of a conventional magnetic resonance (MR) imaging sequence. A pulse sequence is then applied and the data analyzed.

Figure 1:
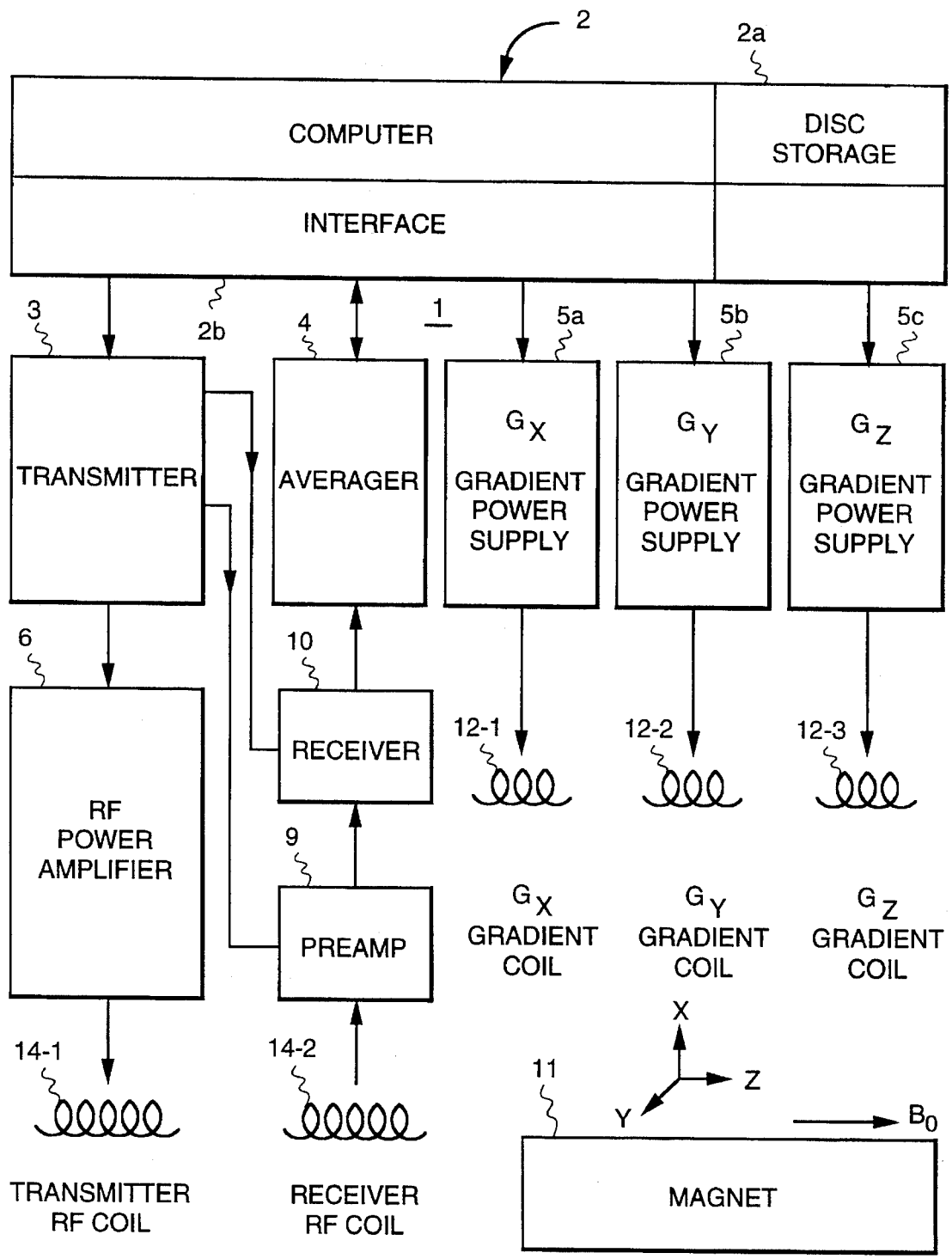
FIG. 1 is a simplified block diagram of a magnetic resonance (MR) imaging system suitable for use with the present invention.

FIG. 1 is a simplified block diagram of the major components of a MR imaging system suitable for use with the invention described herein. The system is made up of a general purpose mini-computer 2 which is functionally coupled to a disk storage unit 2a and an interface unit 2b. A radiofrequency (RF) transmitter 3, signal averager 4, and gradient power supplies 5a, 5b and 5c, are all coupled to computer 2 through interface unit 2b. Gradient power supplies 5a, 5b and 5c energize gradient coils 12-1, 12-2 and 12-3 to create magnetic field gradients $G_x$, $G_y$ and $G_z$, respectively, in the "X", "Y" and "Z" directions respectively, over a subject to be imaged. RF transmitter 3 is gated with pulse envelopes from computer 2 to generate RF pulses having the required modulation to excite an MR response signal from a subject. The RF pulses are amplified in an RF power amplifier 6 to levels varying from 100 watts to several kilowatts, depending on the imaging method, and applied to a transmitter coil 14-1. The higher power levels are necessary for large sample volumes, such as in whole body imaging, and where short duration pulses are required to excite larger NMR frequency bandwidths.

The MR response signal is sensed by a receiver coil 14-2, amplified, in a low noise preamplifier 9 and passed to receiver 10 for further amplification, detection, and filtering. The signal is then digitized for averaging by signal averager 4 and for processing by computer 2. Preamplifier 9 and receiver 10 are protected from the RF pulses during transmission by active gating or by passive filtering.

Computer 2 provides gating and envelope modulation for the MR pulses, blanking for the preamplifier and RF power amplifier, and voltage waveforms for the gradient power supplies. The computer also performs data processing such as Fourier transformation, image reconstruction, data filtering, imaging display, and storage functions (all of which are conventional and outside the scope of the present invention).

Transmitter coil 14-1 and receiver RF coil 14-2, if desired, may comprise a single coil. Alternatively, two separate coils that are electrically orthogonal may be used. The latter configuration has the advantage of reduced RF pulse breakthrough into the receiver during pulse transmission. In both cases, the coils are orthogonal to the direction of a static magnetic field B0 produced by a magnet means 11. The coils may be isolated from the remainder of the system by enclosure in an RF shielded cage.

Magnetic field gradient coils 12-1, 12-2 and 12-3 are necessary to provide gradients $G_x$, $G_y$ and $G_z$, respectively, that are monotonic and linear over the sample volume. Multi-valued gradient fields cause a degradation in the MR response signal data, known as aliasing, which leads to severe image artifacts. Nonlinear gradients cause geometric distortions of the image.

Figure 2:
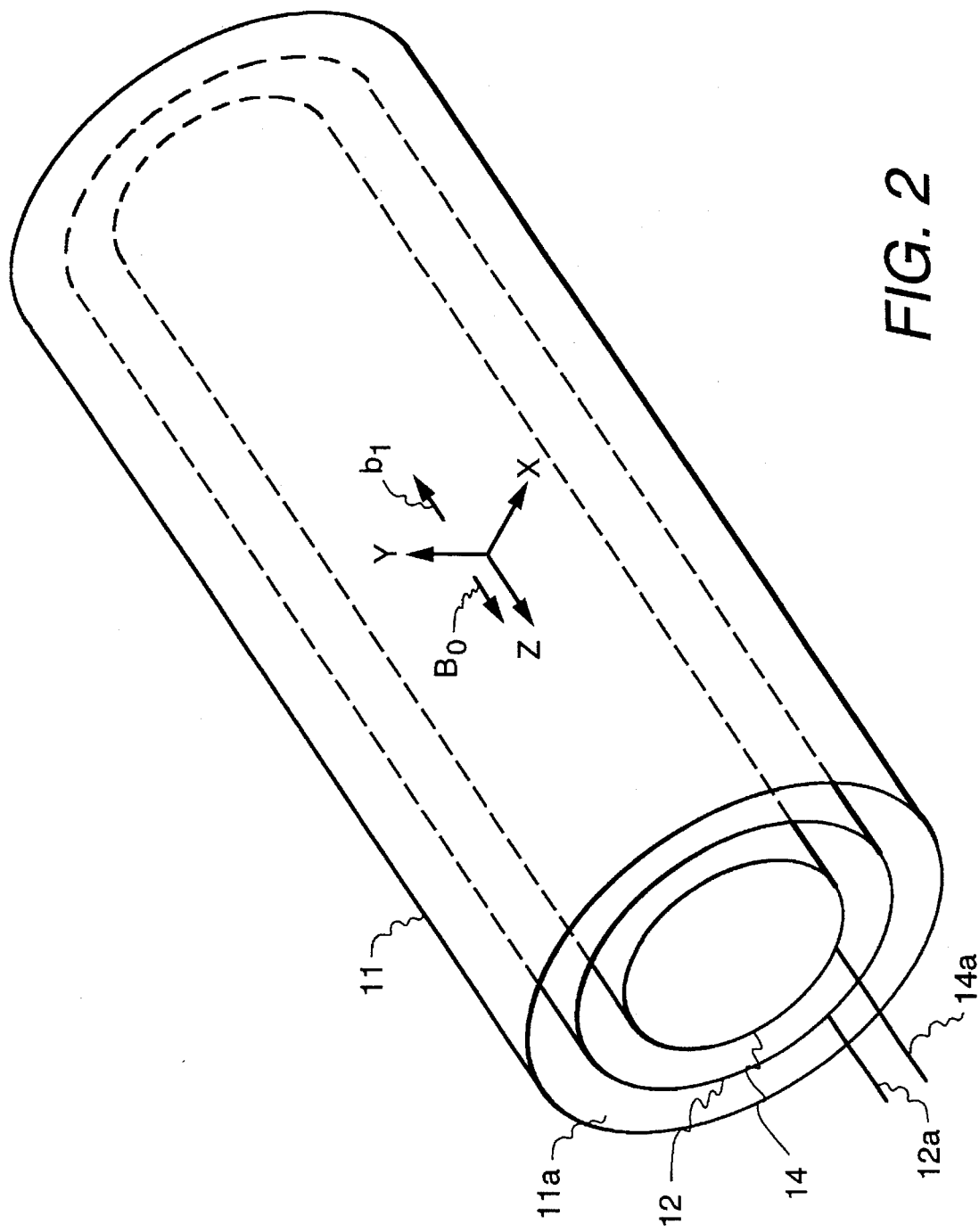
FIG. 2 is a more detailed diagram of the magnet assembly of FIG. 1.

Magnet assembly 11, shown schematically in FIG. 2, has a central cylindrical bore 11a which generates a static magnetic field B0, typically in the axial, or Z Cartesian coordinate direction. A set of coils 12, such as coils 12-1, 12-2 and 12-3 of FIG. 1, receive electrical signals via input connections 12a, and provide at least one gradient magnetic field within the volume of bore 11a. Also situated within bore 11a is an RF coil 14, which receives RF energy via at least one input cable 14a, to provide an RF magnetic field B1, typically in the X-Y plane.

Figure 3A:
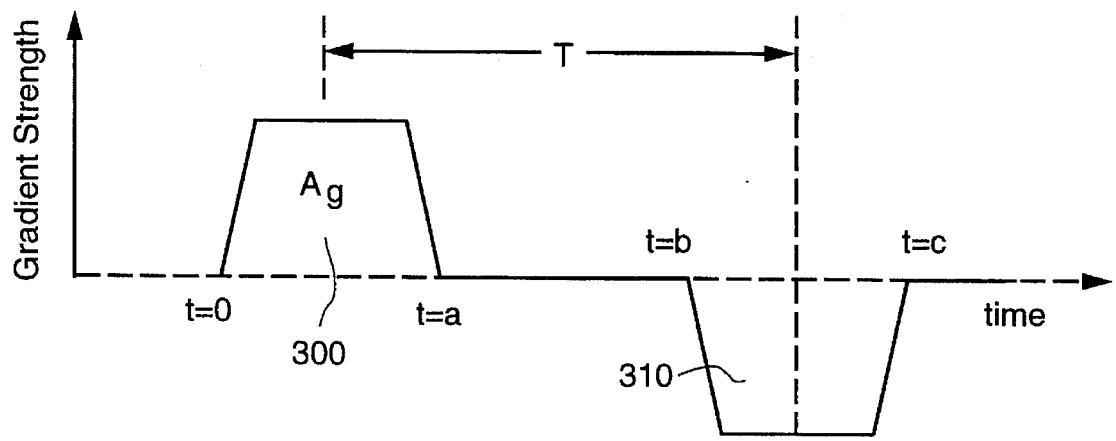
FIG. 3a is a graphical illustration of one embodiment of a velocity-encoding magnetic field gradient pulse sequence which is incorporated into a shear imaging pulse sequence.
Figure 3B:
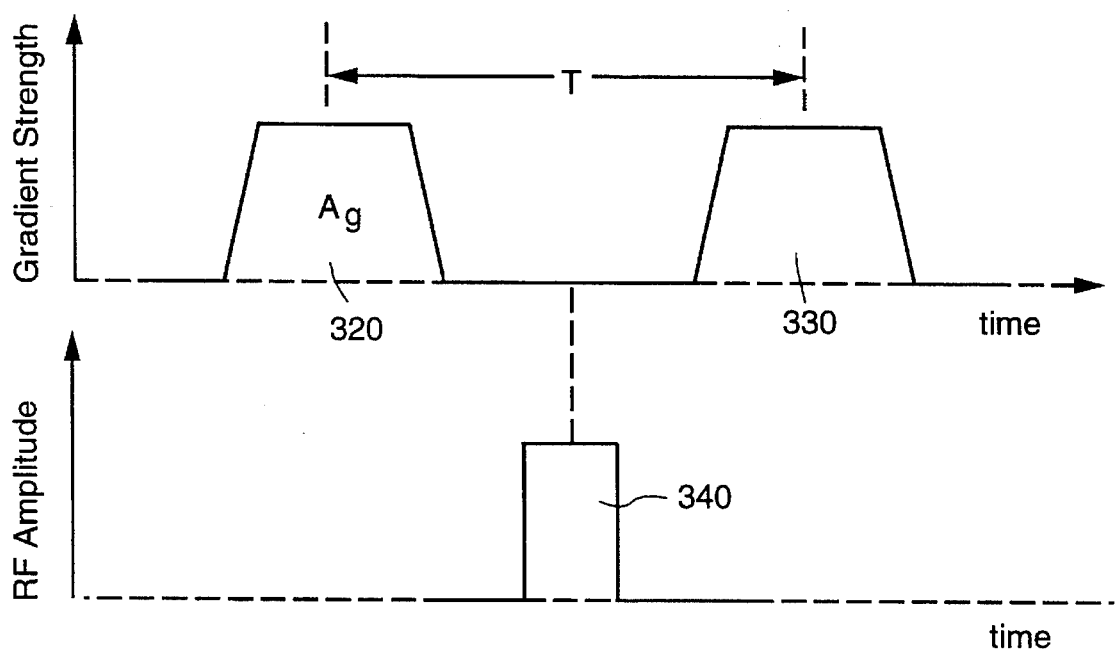
FIG. 3b is a graphical illustration of a second embodiment of a velocity-encoding magnetic field gradient pulse sequence.

FIGS. 3a and 3b show two embodiments of velocity-encoding magnetic field gradient pulse sequences. In FIG. 3a the magnetic field gradient has substantially zero intensity until time t=0. Beginning at t=0 and ending at t=a, a first magnetic field gradient pulse 300 is applied. Beginning at t=b and ending at t=c a second magnetic field gradient pulse 310 having substantially the same duration and intensity of the first gradient pulse, but having opposite polarity, is applied. The time interval between the two gradient pulses is T.

An alternative embodiment of this velocity-encoding gradient pulse is shown in FIG. 3b. This embodiment is similar to the embodiment shown in FIG. 3a with the exception of the addition of a refocusing RF pulse 340 placed between the gradient waveforms 320, 330 and the second waveform 330 having a polarity identical to that of the first gradient pulse 320.

The application of magnetic field gradient pulse sequences such as those of FIGS. 3a and 3b results in a phase shift in transverse spin magnetization which is directly proportional to velocity, the area of each lobe of the pulse sequence being Ag, the gyromagnetic ratio of the nuclear species being t and the time interval between successive gradient lobes being T. This relationship is well known to those skilled in the art and can be expressed as:

$$\Phi = \gamma V T A_g \quad [1]$$

where $\Phi$ is the velocity-induced phase shift and V is the velocity component of the nuclear spin parallel to the applied magnetic field gradient.

Figure 4C:
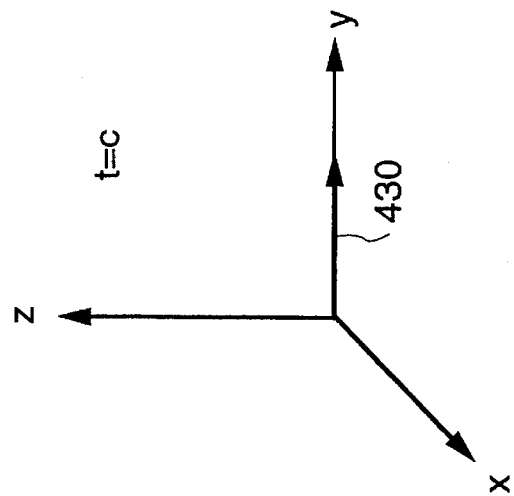
FIG. 4a–4c are vector illustrations of the effect of bipolar magnetic field gradient pulses on stationary spin magnetization.
Figure 4B:
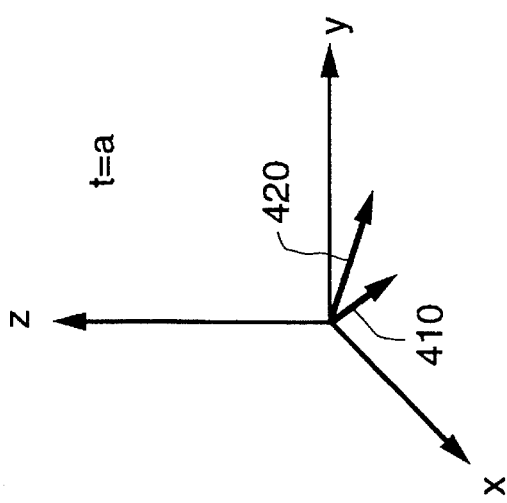
Figure 4A:
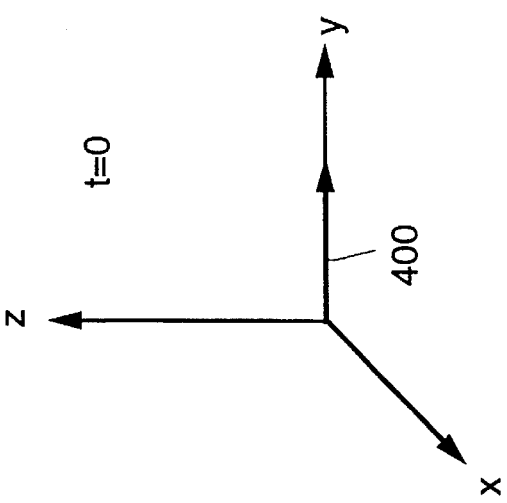

The effect of a velocity-encoding magnetic field gradient pulse on a body of stationary spin magnetization is shown in FIGS. 4a–4c. For the purpose of illustration, only vectors corresponding to the transverse magnetization of two spins at different positions in the direction of the applied velocity-encoding gradient are shown. After the generation of transverse spin magnetization by an RF pulse, all the spins have the same phase and can be represented as a single vector 400 at time t=0, as shown in FIG. 4a. At time t=a, however, each spin has acquired a phase shift which is directly proportional to its position along the magnetic field gradient, as shown in FIG. 4b. These individual vectors 410, 420 arise from spins which do not change position and thus, when the second gradient pulse is applied the phase shifts generated by the first gradient pulse are exactly canceled by the second gradient pulse. Consequently, the phase shifts at time t=c for each spin is identical, and the two vectors coincide and are represented as a single vector 430 in FIG. 4c. The phase shift at time t=c is substantially identical to the phase shift found at time t=0.

Figure 5C:
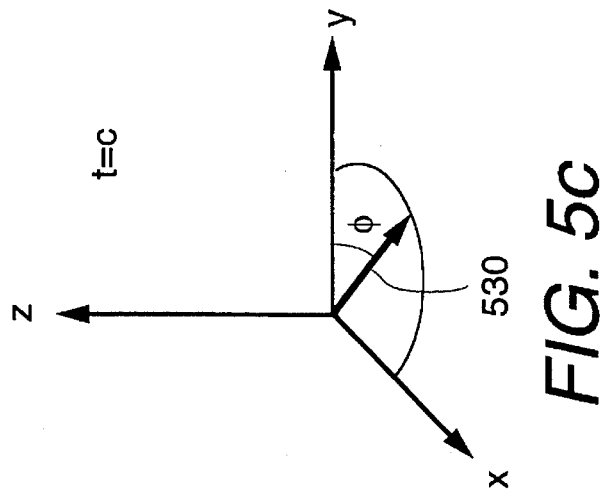
FIG. 5a–5c are vector illustrations of the effect of bipolar magnetic field gradient pulses on moving spin magnetization.
Figure 5B:
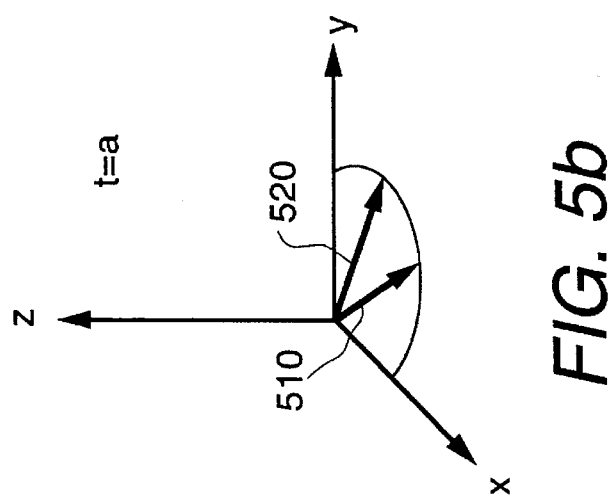
Figure 5A:
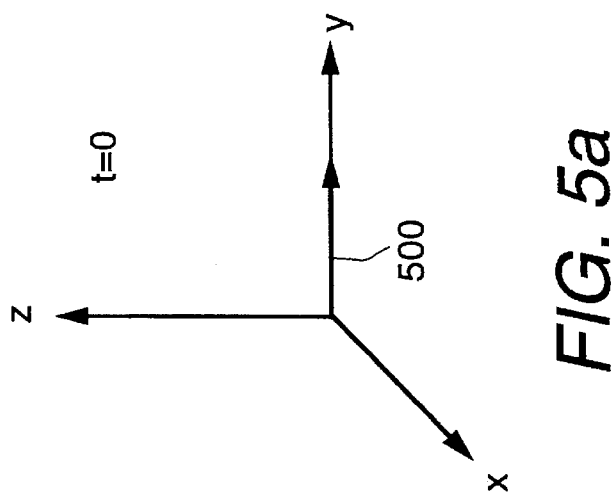

The effect of a velocity-encoding magnetic field gradient pulse on a body of moving spin magnetization shown in FIGS. 5a–5c differs from that on a body of stationary spin magnetization shown in FIGS. 4a–4c. For the purpose of illustration, only vectors corresponding to the transverse spin magnetization of two spins traveling at the same velocity, but at different positions in the direction of the applied velocity-encoding gradient, are shown. After the generation of transverse spin magnetization by an RF pulse, all the spins have the same phase and can be represented as a single vector 500 at time t=0, as shown in FIG. 5a. At time t=a, however, each spin has acquired a phase shift which is directly proportional to its position along the magnetic field gradient as shown by vectors 510, 520 in FIG. 5b. These individual vectors arise from spins which change position with time and thus, when the second gradient pulse is applied, the phase shifts generated by the first pulse are not entirely canceled by the second gradient pulse. Consequently, the phase shift at time t=c, represented by the single vector 530 as shown in FIG. 5c, differs from the phase shift found at time t=0 by an amount $\Phi$. This phase shift is directly proportional to velocity V of equation 1.

Figure 6:
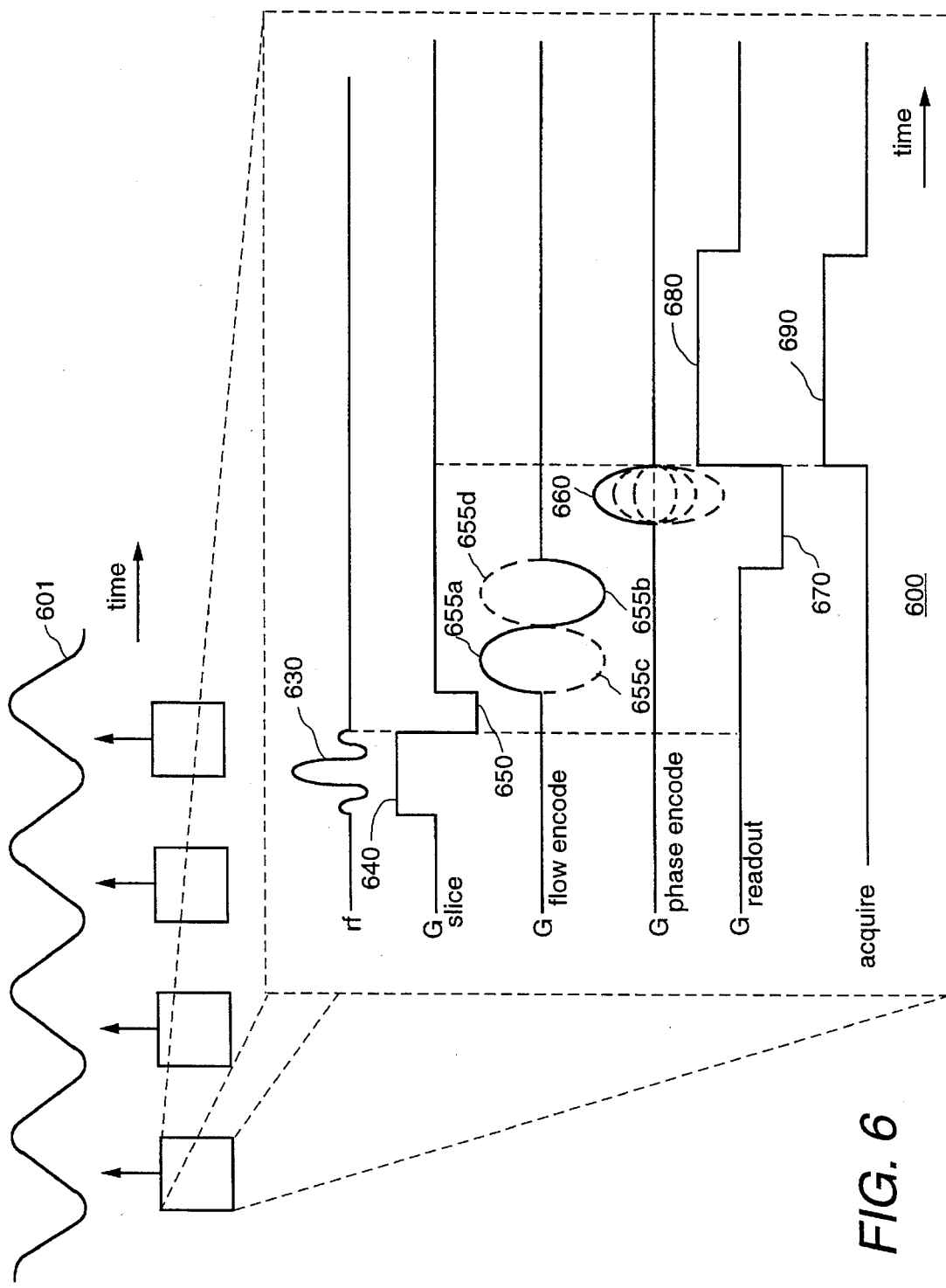
FIG. 6 is pulse sequence diagram of a first embodiment of the present invention which can be used to measure the tissue elasticity within a subject.

FIG. 6 is a pulse sequence diagram of radio frequency (RF) pulses and magnetic field gradients employed in a first embodiment of the present invention which may be executed by the MR imaging system of FIGS. 1 and 2. Pulse sequence 600 is comprised of a excitation RF pulse 630 which is applied in the presence of a slice selective magnetic field gradient pulse 640. Excitation pulse 630 nutates spin magnetization in a selected portion of the subject. The amount of nutation can be selected by selecting the duration and amplitude of excitation pulse 630. The location and size of the selected portion can be adjusted by appropriate selection of the frequency and bandwidth of RF pulse 630 and the amplitude of slice selective magnetic field gradient pulse 640.

After the excitation RF pulse 630 and slice selective magnetic field gradient pulse 640 are applied, a slice refocusing magnetic field gradient pulse 650 is applied. Slice refocusing gradient pulse 650 has an amplitude and duration which is selected to cause all transverse spin magnetization within the selected portion of the subject to be substantially in phase after the application of slice refocusing gradient pulse 640. In the present embodiment the product of the amplitude and duration of slice refocusing gradient pulse 650 is substantially half that of the negative of the product of the amplitude and duration of slice selective gradient pulse 640 in a manner well known to those skilled in the art.

After excitation RF pulse 630 and slice selection gradient pulse 640 have been applied, a bipolar velocity-encoding magnetic field gradient pulse is applied in a selected direction. The velocity-encoding pulse consists of a first velocity-encoding magnetic field gradient pulse lobe 655a and a second velocity-encoding magnetic field gradient pulse lobe 655b. The product of the pulse duration and amplitude of second velocity-encoding pulse lobe 655b is substantially equal to the negative of the product of the pulse duration and amplitude of the first velocity-encoding pulse lobe 655a as described in FIG. 3.

Successive application of first velocity-encoding pulse lobe 655a and second velocity-encoding pulse lobe 655b to transverse spin magnetization causes a phase shift in the net magnetization which is proportional to the velocity component of the spins parallel to the direction of the velocity-encoding magnetic field gradient. This phase shift can be used to distinguish moving from stationary spins.

After excitation RF pulse 630 and slice selection gradient pulse 640 have been applied, a phase encoding magnetic field gradient pulse 660 of a selected amplitude is applied. Phase encoding gradient pulse 660 is applied in a direction substantially orthogonal to slice selective gradient pulse 640 and can be applied simultaneously with slice refocusing pulse 650 if desired. For the sake of clarity, phase encoding pulse 660, velocity-encoding pulses 655a, 655b and slice refocusing pulse 650 are not shown to be simultaneous in FIG. 6, but it is possible to apply combinations of these pulses simultaneously.

After excitation RF pulse 630 and slice selective gradient pulse 640 have been applied, a readout dephasing magnetic field gradient pulse 670 of a selected amplitude is applied. Readout dephasing gradient pulse 670 is applied in a direction substantially orthogonal to both slice selective gradient pulse 640 and phase encoding pulse 660. Readout dephasing pulse 670 can be applied simultaneously with either slice refocusing pulse 650 or phase encoding pulse 660 if desired. Readout dephasing pulse 670 causes the net transverse magnetization at different positions along the direction of the readout dephasing magnetic field gradient to obtain phase shifts which are proportional to position in the readout direction.

Following the application of slice refocusing pulse 650, phase encoding pulse 660 and readout dephasing pulse 670, a readout magnetic field gradient pulse 680 is applied. Readout pulse 680 is applied in the same direction as readout dephasing pulse 670, but is given the opposite polarity. The amplitude and duration of readout pulse 680 is selected so that substantially all transverse spin magnetization has an identical phase shift at a selected point during readout pulse 680.

Substantially simultaneously with readout pulse 680, a data acquire signal pulse 690 is sent to a data acquisition subsystem which is part of the imaging system. MR signals are digitized during data acquire pulse 690. Since the MR signals coming from transverse spin magnetization within the selected portion of the subject are acquired during readout magnetic field gradient 680, each detected MR signal will have a frequency which is proportional to the location of the position of the transverse spin magnetization which generated said signal. The location of each signal source can be determined by applying a Fourier transformation to the acquired signal data in a fashion well known to those skilled in the art.

In the present invention pulse sequence 600 is applied at selected times during an externally induced displacement of the tissue 601. This displacement is periodic, but can take any form (e.g. sinusoidal, triangle, impulse etc.). By synchronizing pulse sequence 600 to the externally induced displacement, the instantaneous velocity of each portion of tissue imaged is substantially identical for each application of pulse sequence 600.

In the present invention pulse sequence 600 is repeated a plurality, N, times to form a single frame of data which has sufficient information to permit the measurement of at least one component of stress. The acquisition of a frame is repeated a plurality, Y, times. In each frame acquisition, phase encoding pulse 660 is given a different amplitude. Phase encoding pulse 660 causes phase shifts in the detected MR signals which are proportional to the position of transverse spin magnetization along the direction of phase encoding magnetic field gradient 660. Data acquired responsive to different amplitudes of phase encoding gradient 660 can be Fourier transformed to give the position (in the direction of phase encoding gradient 660) of the signal producing transverse spin magnetization in a manner well known to those skilled in the art.

In a first embodiment of the present invention, each frame consists of N=4 applications of pulse sequence 600. In the first application, velocity-encoding gradient pulses 655a, 655b are applied with a selected polarity. This causes the phase of the transverse spin magnetization to be proportional to velocity. The phase of each portion of net transverse spin magnetization, however, will also have contributions from sources other than velocity. These sources may include transmitter offsets, chemical shift effects and eddy currents.

In order to remove contributions from all components other than velocity, pulse sequence 600 is applied a second time and a second data set is acquired. The RF and magnetic field gradient pulses of the second application are identical to that of the first with the exception of first velocity-encoding pulse lobe 655a and second velocity-encoding pulse lobe 655b. In their place a third velocity-encoding pulse lobe 655c followed by a fourth velocity-encoding pulse lobe 655d are applied. Third and fourth velocity-encoding pulse lobed 655c, 655d are identical to first and second velocity-encoding pulse lobes 655a, 655b respectively, except that they have opposite polarity. Data collected in the first application is then subtracted from data collected in the second application to give a first difference data set. Phase shifts induced by the third and fourth velocity-encoding gradient lobes have opposite polarity relative to the phase shifts induced by the first and second as velocity-encoding gradient lobes.

When the phase of data acquired responsive to the first application of pulse sequence 600 is subtracted from the phase of the data acquired responsive to the second application of pulse sequence 600, phase contributions from all non-velocity sources are substantially canceled, leaving only a phase shift arising from velocity. This phase shift is directly proportional to velocity and can be used to quantify velocity.

Figure 7:
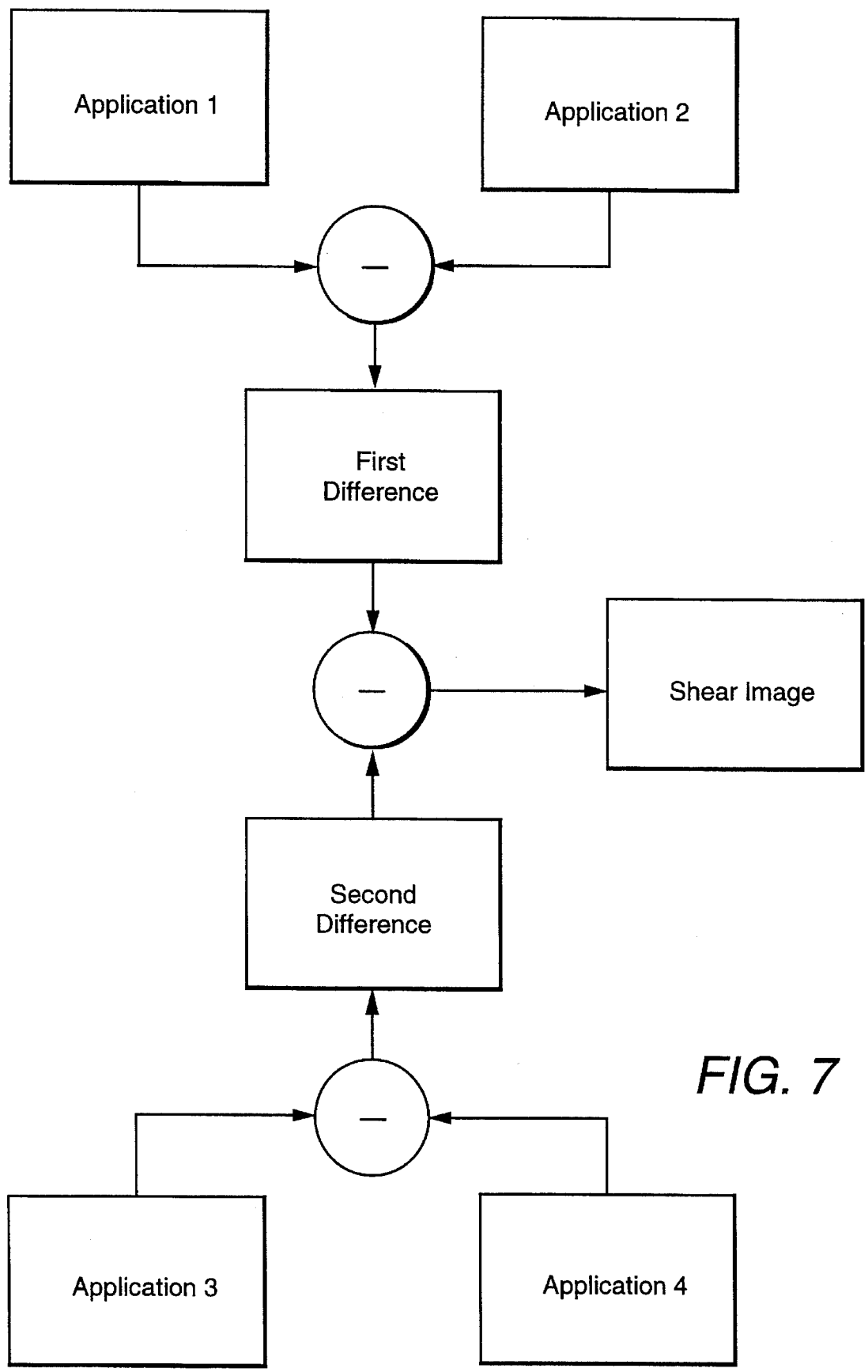
FIG. 7 is a schematic diagram illustrating the data processing steps required to obtain shear images using the pulse sequence shown in FIG. 6.

A third and fourth application of pulse sequence 600 are then performed in a manner identical to that of the first and second application, respectively, with the exception that the center of the field-of-view is shifted in a selected direction by a selected amount, D. A second difference data set is generated responsive to the third and fourth application of pulse sequence 600. Shear information, which is defined as the changes in velocity with respect to the direction of the field-of-view shift, can be calculated by computing the differences of the phases of the first and second difference data sets as illustrated in FIG. 7. It should be noted that the shift in the center of the field-of-view can be less than the size of a single pixel in the final image.

The direction selected for shifting the center of the field-of-view determines how pulse sequence 600 will be modified in the is third and fourth applications. If the selected direction is parallel to the direction of the slice selection gradient pulse 640, the field-of-view shift is performed by changing the frequency of both the transmitter 3 and receiver 10 of the MR imaging system by an amount F which is determined by the gyromagnetic ratio of the nuclear spins and the strength of slice refocusing gradient pulse 650. If the selected direction is parallel to the direction of the readout gradient pulse 680, the field-of-view shift is performed by changing the frequency of either the receiver 10 or the transmitter 3 by an amount F' which is determined by the gyromagnetic ratio of the nuclear spins, the data acquisition rate and the strength of the readout gradient pulse 680. If the selected direction is parallel to the direction of the phase encoding gradient pulse 660, a phase shift is added to the phase of the transmitter. This phase shift is incremented by an amount P for each of the Y increments of phase encoding gradient pulse 660. The incremental phase shift P is determined by the gyromagnetic ratio of the nuclear spins, the field-of-view and Y and is directly proportional to the product of the amplitude and duration of phase encoding gradient pulse 660.

The modifications to pulse sequence 600 which are required to perform changes in the center of the field-of-view are summarized in table 1. Note that shifting the field-of-view center can only be performed in a single desired direction for each frame. Consequently, if all components of stress are to be measured, frames for each of three velocity directions must be measured with respect to each of three orthogonal spatial dimensions, for a total of nine measurements. Since each frame in the present embodiment requires four repetitions of pulse sequence 600, a total of 9×4=36 repetitions of pulse sequence 600 are required to measure all components of stress.

TABLE 1

| Application | Flow Encoding | Slice Select Shift | Readout Shift | Phase-encoding Shift |
|---|---|---|---|---|
| 1 | 655a, 655b | 0 | 0 | 0 |
| 2 | 655c, 655d | 0 | 0 | 0 |
| 3 | 655a, 655b | F | F' | P |
| 4 | 655c, 655d | F | F' | P |

In a second embodiment of the current invention, the detection of orthogonal components of velocity are multiplexed to more efficiently acquire all components of stress. Using a Hadamard multiplexing scheme it is possible to obtain quantitative information for all three velocity vector components at a selected field-of-view offset With only four applications of pulse sequence 600. All stress components can then be determined by collecting additional data responsive to field-of-view shifts in the slice select, readout and phase encoding directions. Such a scheme requires only 4×4=16 applications of pulse sequence 600. One embodiment of such a scheme is given in table 2. Here "+" denotes the application of first and second velocity-encoding pulses as 655a, 655b and "−" denotes the application of third and fourth velocity-encoding pulses 655c, 655d. In this embodiment applications 1–4 are used to obtain the three-mutually orthogonal velocity vectors for the unshifted field-of-view, applications 5–8 are used to obtain the three-mutually orthogonal velocity vectors for the data shifted in the slice select direction, applications 9–12 are used to obtain the three-mutually orthogonal velocity vectors for the data shifted in the readout direction, and applications 13–16 are used to obtain the three-mutually orthogonal velocity vectors for the data shifted in the phase encoding direction. After Hadamard demultiplexing of individual components of velocity, shear images with respect to the slice select direction can be obtained by subtracting data acquired in applications 1–4 from data acquired in applications 5–8. Likewise, shear images with respect to the readout direction can be obtained by subtracting data acquired in applications 1–4 from data acquired in applications 9–12 and shear images with respect to the phase encoding direction can be obtained by subtracting data acquired in applications 1–4 from data acquired in applications 13–16.

TABLE 2

| Applic. No. | Flow Encoding SS | Flow Encoding RO | Flow Encoding PE | Slice Select Shift | Readout Shift | Phase-encoding Shift |
|---|---|---|---|---|---|---|
| 1 | + | + | + | 0 | 0 | 0 |
| 2 | − | − | + | 0 | 0 | 0 |
| 3 | − | + | − | 0 | 0 | 0 |
| 4 | + | − | − | 0 | 0 | 0 |
| 5 | + | + | + | F | 0 | 0 |
| 6 | − | − | + | F | 0 | 0 |
| 7 | − | + | − | F | 0 | 0 |
| 8 | + | − | − | F | 0 | 0 |
| 9 | + | + | + | 0 | F' | 0 |
| 10 | − | − | + | 0 | F' | 0 |
| 11 | − | + | − | 0 | F' | 0 |
| 12 | + | − | − | 0 | F' | 0 |
| 13 | + | + | + | 0 | 0 | P |
| 14 | − | − | + | 0 | 0 | P |
| 15 | − | + | − | 0 | 0 | P |
| 16 | + | − | − | 0 | 0 | P |

Magnetic resonance to measurement of shear rates in tissue responsive to an externally applied mechanical motion has several potential applications. For example, if a compressive force is delivered at the surface of the tissue to be imaged the elasticity of tissue below the surface can be measured. For a simple harmonic system with elastic constant k, mass m, and damping coefficient λ, the differential equation describing the response to a mechanical forcing function of amplitude f and frequency λ can be written as:

$$x''+2\lambda x'+\Phi 2x=(f/m) \cos(\gamma t) \qquad [2]$$

where x is the spatial coordinate in the direction of the applied force, x' and x" are the first and second time derivatives, respectively, Φ=k/m and γ is the frequency of the driving force oscillation.

Figure 8:
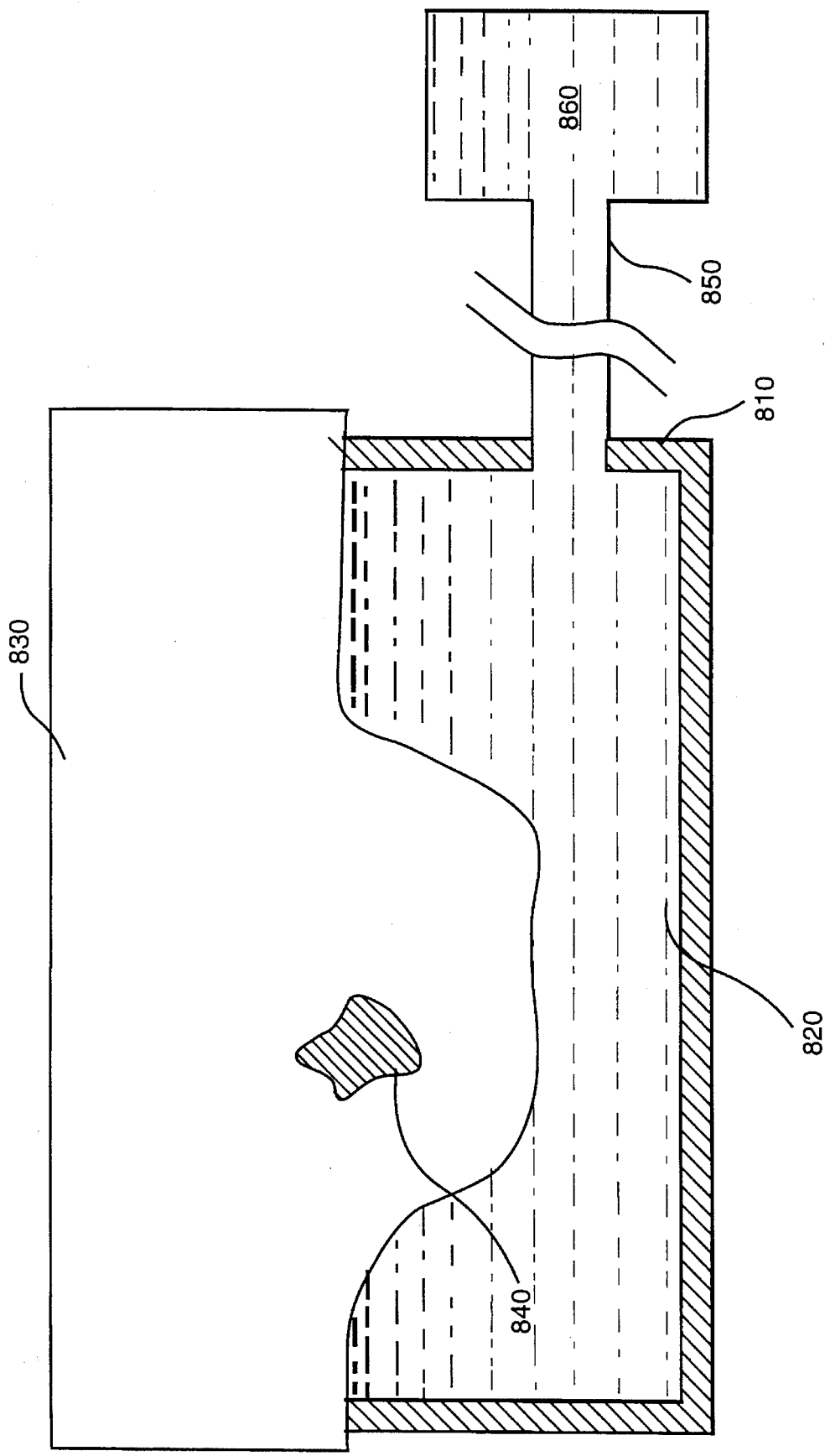
FIG. 8 is a schematic diagram illustrating a simple device to provide mechanical motion to tissue within a subject during the application of pulse sequence shown in FIG. 6.

Mechanical vibrations within tissue can be created by an MR compatible driver such as the one shown in FIG. 8. This driver is comprised of a non-magnetic housing 810 which contains a is coupling fluid 820. Coupling fluid 820 is typically water, but could be a aqueous solution or a non-aqueous fluid if desired. Tissue to be imaged is placed within non-magnetic housing 810 and is surrounded by coupling fluid 820. The pressure of coupling fluid 820 is periodically varied to cause motion in the tissue. Normal tissue 830 will exhibit normal elastic properties whereas a portion of abnormal tissue 840 will exhibit an increased or decreased elastic properties. Imaging performed with the present invention is synchronized to the pressure variations applied to coupling fluid 820. Pressure variations to coupling s fluid 820 are caused by a pressure creation means 860 which can be constructed with a piezoelectric device, motor driven piston or the like. Pressure increases are propagated to non-magnetic housing 810 via a conduit 850. Ideally the pressure variations should permit sufficiently large maximum velocities (1 cm/sec or higher) and low total tissue displacement (less than 5 mm) in order to minimize subject discomfort.

In an alternative embodiment of the present invention, the oscillating mechanical force can be achieved by placing the tissue in contact with a moving plate. This plate can be translated or rotated to cause tissue motion. As with the apparatus shown in FIG. 8, imaging is synchronized with the motion of the plate.

In yet another alternative embodiment of the present invention, gradient waveforms which encode higher orders of motion such as acceleration and jerk can be employed. This can be accomplished by adding lobes to the velocity encoding gradient waveforms in a manner well known to those skilled in the art.

In yet another alternative embodiment of the present invention, other forms of velocity-sensitive magnetic resonance imaging such as, velocity-sensitive echo-planar imaging or velocity-sensitive spin-echo imaging can be employed.

While several presently preferred embodiments of the novel MR tissue elasticity imaging method have been described in detail herein, many modifications and variations will now become apparent to those skilled in the art. It is, therefore, to be understood that the appended claims are intended to cover all such modifications and variations as fall within the true spirit of the invention.

What is claimed is:

1. A method for the generation of elasticity images of a subject with magnetic resonance (MR), comprising the steps of:

a) placing said subject into a magnetic field to polarize nuclear spins within said subject;

b) vibrating a desired portion of said subject with a selected periodicity and amplitude;

c) applying a slice select magnetic field gradient in a first direction to the vibrating portion of said subject;

d) applying a radiofrequency (RF) pulse having a selected frequency and phase to nutate an ensemble of nuclear spins simultaneous with the application of the slice select magnetic field gradient thereby creating rotating net transverse magnetization in a slice of the vibrating portion of the subject, the slice being oriented perpendicular to the first direction;

e) applying a phase encoding magnetic field gradient pulse of a selected amplitude in a second direction substantially orthogonal to the first direction;

f) applying a velocity-encoding magnetic field gradient pulse of a selected polarity in a selected direction independent of the first and second directions to the subject to cause the net transverse magnetization to experience a phase shift proportional to the velocity of the nuclear spins in the direction of the velocity-encoding magnetic field gradient;

g) applying a readout magnetic field gradient pulse in a third selected direction substantially orthogonal to the first and second directions to create an MR response signal having a frequency proportional to spin location along the direction of the applied readout magnetic field gradient;

h) receiving the MR response signal at a selected frequency to result in a first MR data set;

i) repeating steps 'c'–'h' with a velocity-encoding gradient pulse polarity substantially opposite that of the prior repetition to result in a second MR data set;

j) subtracting the first MR data set from the second MR data set to result in a first difference data set indicating changes due to the velocity-encoding magnetic field gradient pulse;

k) repeating steps 'c'–'j' with a selected field-of-view offset in at least one of the first, second and third directions to result in a second difference data set;

l) subtracting the first difference data set from the second difference set to result in a shear rate data set;

m) repeating steps 'c'–'l' a plurality of Y repetitions, with each repetition having a unique amplitude for the phase encoding gradient pulse to result in Y phase encoded shear rate data sets; and n) Fourier transforming the Y phase encoded shear rate data sets to reconstruct an elasticity image of the vibrating portion of said subject.

2. The method of claim 1 where the field-of-view offset in the first direction is accomplished by changing the frequency of the RF pulse and the receiving frequency by an amount F.

3. The method of claim 1 where the field-of-view offset in the second direction is accomplished by selecting the phase of the RF pulse to be proportional to the amplitude of the phase encoding gradient for each of the Y repetitions.

4. The method of claim 1 where the field-of-view offset in the third direction is accomplished by changing the receiving frequency with respect to the RF pulse by an amount F'.

5. A method for the generation of elasticity images of a subject with magnetic resonance (MR), comprising the steps of:

a) placing said subject into a magnetic field to polarize nuclear spins within said subject;

b) vibrating a desired portion of said subject with a selected periodicity and amplitude;

c) obtaining a first velocity-sensitive MR image comprised of a plurality of pixel values, synchronized with the vibrations having a first field-of-view offset;

d) obtaining a second velocity-sensitive MR image comprised of a plurality of pixel values, synchronized with the vibrations having a second field-of-view offset;

e) subtracting pixel values of the first velocity-sensitive MR image from corresponding pixel values of the second velocity-sensitive image to reconstruct an elasticity image of the vibrating portion of said subject.

* * * * *